United States Patent [19]

Nissen et al.

[11] 4,295,158

[45] Oct. 13, 1981

[54] DIGITAL FREQUENCY DIVIDER

[75] Inventors: Nico Nissen, Hamburg, Fed. Rep. of Germany; Sebastianus J. Op Het Veld; Henri W. Schneider, both of Eindhoven, Netherlands

[73] Assignee: U.S. Philips Corporation, New York, N.Y.

[21] Appl. No.: 75,472

[22] Filed: Sep. 14, 1979

Related U.S. Application Data

[63] Continuation-in-part of Ser. No. 942,470, Sep. 14, 1978, abandoned.

[30] Foreign Application Priority Data

Sep. 20, 1977 [DE] Fed. Rep. of Germany ....... 2742184

[51] Int. Cl.³ .............................................. H04N 9/44
[52] U.S. Cl. ................................. 358/17; 307/225 R; 328/39; 328/41; 358/150

[58] Field of Search ..................... 358/17, 18, 19, 150; 307/225 R; 328/39, 41

[56] References Cited

U.S. PATENT DOCUMENTS 3,663,743  5/1972  Dann ..................................... 358/17

*Primary Examiner*—Robert L. Richardson
*Attorney, Agent, or Firm*—Thomas A. Briody; Robert T. Mayer; James J. Cannon, Jr.

[57] ABSTRACT

A simple and reliable digital frequency divider for non-integer rational divisors using a signal polarity switch commanded by an auxiliary counter which derives its counting pulses from a main N-position counter. For such complex divisors the generation of phase leads by toggling the signal polarity switch can be delayed or some phase leads can be suppressed by using relatively low-frequency delay pulses, to avoid large auxiliary counters. Video timing circuits are described based on digital frequency dividers of such types.

6 Claims, 12 Drawing Figures

DIGITAL FREQUENCY DIVIDER

This is a continuation-in-part of application Ser. No. 942,470, filed Sept. 14, 1978, now abandoned.

BACKGROUND OF THE INVENTION

1. Field of the Invention

The invention relates to a digital frequency divider having a divider input for electrical input pulses and a divider output for an electrical output signal and comprising an N-position counter having a counter input and at least one counter output, wherein the divider input is coupled to the counter input and the divider output is connected to the counter output, which frequency divider further comprises a signal polarity switch and a B-position auxiliary counter of which an auxiliary counter input is coupled to a counter output of the N-position counter and an auxiliary counter output commands the signal polarity switch of which a switch input is coupled to the divider input and a switch output is coupled to the counter input of the N-position counter.

2. Description of the Prior Art

Frequency dividers of this type are commonly used to obtain pulse sequences with a lower pulse repetition frequency from a pulse source with a relatively high pulse repetition frequency, comprising a n-bit counter with N possible positions for dividing the higher frequency by a rational non-integer factor of the general form $N - A/B$ in which A, B and N are positive integers and in which A And B have no common divisor.

A frequency divider of the type mentioned above is described in the U.S. Pat. No. 3,896,387, especially in the embodiment as described in relation to FIGS. 7 and 8 of that specification, which frequency divider divides by a factor $4-(\frac{1}{2})=3\frac{1}{2}$ in that example. For this purpose, the frequency divider comprises a signal polarity switch and a 2-position auxiliary counter of which an auxiliary counter input is coupled to the counter output of the N-position counter and an auxiliary counter output commands the signal polarity switch of which a switch input is coupled to the divider input and a switch output is coupled to the counter input of the N-position counter.

For the B-position auxiliary counter clearly b bits are necessary with $B \leq 2^b$.

Every time the output of the auxiliary counter output signal changes its polarity, the signal polarity switch switches the polarity of the incoming pulses, introducing a 180° phase-lead. This has the same effect as adding one counting pulse at the output of the signal polarity switch for every output pulse of the auxiliary counter.

Considering a time interval in which the signal polarity switch presents $B \times N$ pulses at the counter input of the N-position counter, then in this time interval this number will be divided by N so that B pulses will be generated at the counter output of the N-position counter, enabling the B-position counter to count through a full B-position cycle. During such a cycle the auxiliary counter output generates an integer number of $A_1$ pulses with $A_1 \leq B$, depending on the way counter positions are decoded. Therefore, in the time interval considered, a number $A_1$ of pulses generated by the auxiliary counter commanding the signal polarity switch has effected $A_1$ extra pulses at the output of the signal polarity switch.

If the original number of pulses at the divider input during the time interval considered is denoted as $P_o$, then clearly $$B \times N = P_o + A_1$$

or $$P_o = B \times N - A_1$$

In the same time interval the divider output receives B pulses from the counter output of the N-position counter, so that the ratio between the incoming and outgoing pulse frequencies is $$\frac{P_o}{B} = \frac{B \times N - A_1}{B} = N - \frac{A_1}{B}.$$

The embodiment in which the auxiliary counter is a divide-by-2 circuit is especially adapted for division by a factor $N-\frac{1}{2}$ as needed for video timing circuits for NTSC-video systems, as used in video games, Viewdata decoders or other digitized displays.

Although any rational non-integer divisor can be implemented with the embodiment as described above, this may lead to a costly implementation in some cases. For example: in the PAL-video system a colour subcarrier of 4433618.75 Hz nominal and a video line frequency of 15625 Hz nominal are required.

The first frequency can be derived from a standard PAL crystal oscillator for a frequency of twice the subcarrier frequency $f_{sc}$ using a divide-by-2 circuit. The second frequency would require a division by $$\frac{2 \times 4433618.75}{15625} = 567.5032$$

which can be written as $$N - \frac{A}{B} = 568 - \frac{621}{1250}.$$

This means that the auxiliary counter seems to need 11 bits for counting through B=1250 positions.

SUMMARY OF THE INVENTION

The aim of the invention is to provide a frequency divider in which this result is obtained in a simpler and straightforward way. To this end a frequency divider according to the invention is characterized in that the frequency divider comprises a delay circuit with a delay input for electrical delay pulses, which delay circuit delays the action of the frequency divider for at least one half period of a sequence of electrical input pulses at the divider input for each single delay pulse.

This has the effect that periodically at least one of the phase leads that would otherwise have been obtained is left out, which gives the same result as if less pulses are seemingly added or as if pulses from the clock signal are made inoperative.

In the example as given for the PAL-system it is possible to suppress 100 phase-leads per second using 100 Hz or 50 Hz delay pulses so that the frequency divider seems to function as if it received (2×4,433,618.75−50) pulses per second.

Using now a frequency divider for a divisor of 567.5, with only a one-bit auxiliary counter, the resulting output will have an average frequency of $$\frac{2 \times (4433618.75 - 25)}{567.5} = 15625 \text{ Hz nominal}$$

It is also possible to use a digital frequency divider for a divisor 2.5 according to this embodiment. This gives a frequency of $$\frac{2 \times (4433618.75 - 25)}{2.5} = 3546875 \text{ Hz}$$

Dividing this with a normal divide-by-227 circuit gives again $$\frac{3546875}{227} = 15625 \text{ Hz nominal}$$

Although the total number of counting bits required is exactly the same, this solution has the added advantage that an intermediate frequency of about 3.5 MHz is available which is the usual clock frequency for U.S. video NTSC systems, so that it is possible to easily use large scale integrated circuits designed for the NTSC clock frequency as parts in a European PAL-system.

Using the standard PAL oscillator frequency of 8,867,237.5 Hz nomianl in the examples given above means that the 15,625 Hz line-frequency $f_h$ is derived from $2(f_{sc}-25)$Hz, usually indicated as the 25 Hz offset required by the PAL-system.

$$f_H = \frac{2(f_{sc} - 25)}{567.5} \text{ or}$$

$$283.75 f_H = f_{sc} - 25$$

or $$f_{sc} = 283.75 f_H + 25$$

Several specific embodiments of this general nature will be discussed hereunder.

BRIEF DESCRIPTION OF THE DRAWINGS

The invention will be explained in detail with the help of the drawings.

In the drawings.

DESCRIPTION OF THE PREFERRED EMBODIMENT

Figure 1:
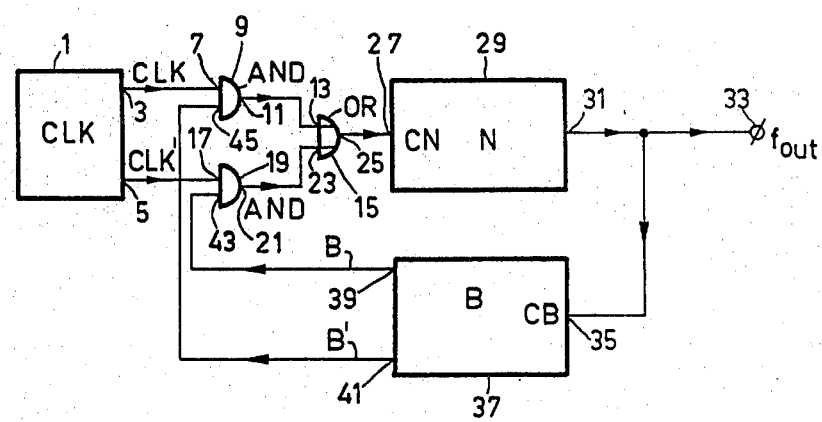
FIG. 1 shows a simplified block diagram of a first embodiment of a frequency divider according to the state of the art.

In FIG. 1 the basic set-up of a frequency divider uses a clock oscillator 1 having two outputs 3 and 5 for a clock signal CLK and its inverted or antiphase signal CLK' respectively. Output 3 is connected to an input 7 of an AND-gate 9 of which an output 11 is connected to an input 13 of an OR-gate 15. Oscillator output 5 is connected to an input 17 of an AND-gate 19 of which an output 21 is connected to a further input 23 of the OR-gate 15. The output 25 of the OR-gate 15 is connected to a counting input 27 (indicated by CN) of a N-position counter 29 of which an output 31 is connected to the output 33 of the frequency divider and to the input 35 (indicated by CB) of a B-position auxiliary counter 37 having two antiphase outputs B and B', 39 and 41 respectively, usually the outputs of the last flip-flop of the auxiliary counter, or the only flip-flop if B=2. Output 39 is connected to a further input 43 of the AND-gate 21 and output 41 is connected to a further input 45 of the AND-gate 9.

The clock oscillator may consist of a symmetrical circuit with two antiphase outputs, or may consist of a single output oscillator combined with a common inverter to generate CLK' from CLK.

Depending on the counting position of the auxiliary counter 37 either B="0" and B'="1" or B="1" and B'="0".

In the first case the output 11 of the AND-gate 9 will follow the CLK signal and the AND-gate 19 is blocked by B="0" on its input 43. Therefore the output 25 of the OR-gate 15 will also follow the CLK signal so that CN=CLK. In the other case clearly CN=CLK' will be found.

Assuming that the content of the B-position counter only changes somewhere between two edges of the CLK signal, every time such a change occurs the signal CN will have an extra polarity reversal when changing from in phase with CLK to antiphase with CLK or vice-versa.

For each output pulse of the auxiliary counter this happens twice, at the front edge and at the end edge of the pulse so that the signal CN contains one more pulse than the signal CLK contained within a period in which one B pulse is generated.

A full counting cycle requires B-positions for the auxiliary counter and each counting step is originated just after a full cycle of N positions of the N-position counter. Counting through such a full cycle therefore requires a number of B×N pulses CN. Defining the number of B-pulses generated as the number A then the number of CLK pulses in the same full cycle period has been B×N−A. In the same full cycle the number of output pulses $f_{out}$ at the divider output 33 clearly is the number of CN-pulses divided by N $$\frac{B \times N}{N} = B$$

The frequency divider therefore operates with a reduction factor or divisor $$\frac{B \times N - A}{B} = N - \frac{A}{B}.$$

The signal CN is formed as CLK.B' or CLK'.B, the period symbol indicates the AND-function. Using the + sign for an OR-function the Boolean notation becomes in full:

CN=CLK.B'+CLK'.B

Figure 2:
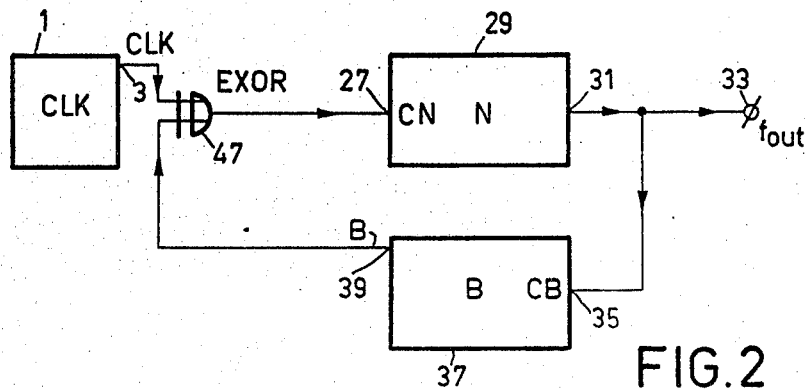
FIG. 2 shows the same embodiment using a slightly different binary notation.

This is the well known EXCLUSIVE-OR-function, as shown in FIG. 2. In this Figure and in the other Figures the same position indicators are used throughout for corresponding elements.

The schematic notation as used in FIG. 2 where the gates 9, 19 and 25 have been replaced by the EXOR-gate 47 is also used in the further diagrams. This must be seen as a simplified notation for the signal polarity switch but does not imply that an actual EXOR-gate has to be used. It is also possible to combine elements of the signal polarity switch such as 9, 19 and 25 with other gates to larger logical circuits as may happen in large scale integrated circuits. These however will still comprise the signal polarity switching function.

The frequency dividers as shown in FIGS. 1 and 2 are inherently the same.

Figure 3:
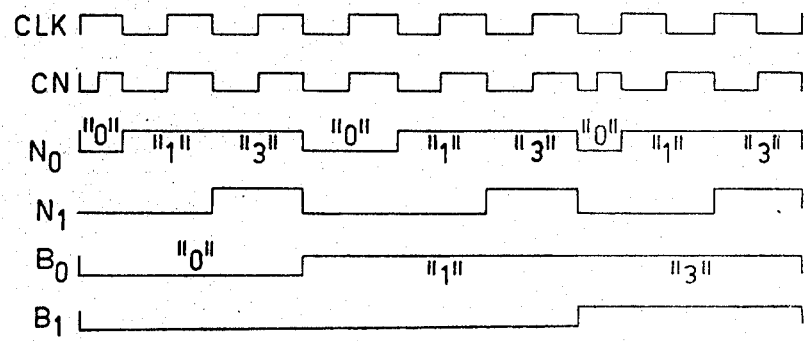
FIG. 3 shows a timing diagram for a frequency divider of FIG. 1 or 2 for N=3, B=3, $A_1$=1.

An example of a timing diagram for such a frequency divider is shown in FIG. 3. The chosen example has two counters each having two flip-flops, each counting modulo-3, each going through the binary positions 00, 01 and 11 successively indicated in the figure as "0", "1" and "3" and $N_1$ are used as the flip-flop outputs for first and second flip-flop respectively, and similarly $B_o$ and $B_1$.

Assumed is, again by way of example, that the flip-flops change their contents at the end edge or negative edge of a pulse, but this is not essential and may depend on the actual realization of the counters for which many types of flip-flops such as D-, RS- or positive edge JK-flipflops may be used.

It can be seen that the signal CN has an extra polarity change shortly after each edge of a $B_1$-pulse. The full cycle contains $3 \times 3 = 9$ CN pulses, one "$B_1$-pulse" and 8 CLK pulses. The output signal $N_1$ connected to $f_{out}$ on output 33 shows three pulses, therefore the divisor is 8/3.

In this example N=3, B=3 and A=1 so that $$N - \frac{A}{B} = 3 - \frac{1}{3} = \frac{8}{3}.$$

Figure 4:
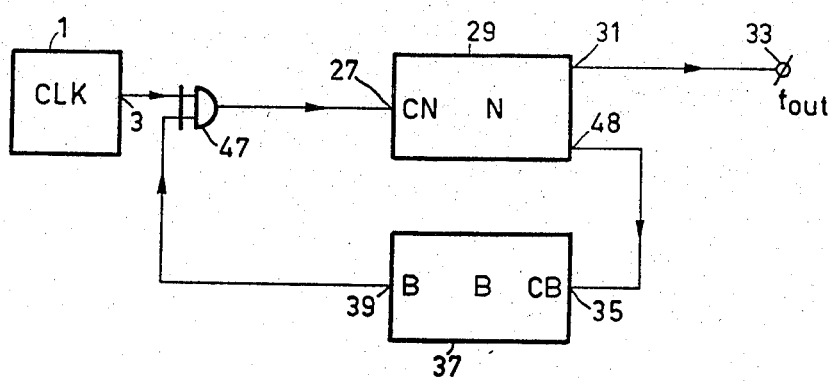
FIG. 4 shows a simplified block diagram of a second embodiment.

In FIG. 4 another embodiment is shown in which the input 35 of the auxiliary counter 37 is not connected to the output 31 of the N-position counter but to a further output 48 of this counter.

This output 48 is connected to a counter decoding circuit in the N-position counter generating $A_2$ pulses for every full cycle of the N-position counter.

The number of output pulses from the auxiliary counter is given as $A_1$ for every complete cycle of the B-position counter.

A full divider cycle is again taken as B×N palses CN. The output 48 generates in this example $$\frac{B \times N}{N} \times A_2 = A_2 \times B$$

pulses during this period.
This gives $$\frac{A_2 \times B}{B} = A_2$$

complete cycles of the auxiliary counter and therefore $A_1 \times A_2$ B-pulses, so that the number of clock pulses CLK in this same period now equals $B \times N - A_1 \times A_2$.

The number of output pulses on the outputs 31, 33 is still $$\frac{B \times N}{N} = B,$$

the divisor becomes thus $$\frac{B \times N - A_1 \times A_2}{B} = N - \frac{A_1 \times A_2}{B} = N - \frac{A}{B}$$

if $A = A_1 \times A_2$

Normally we will use $A_1 < B$ and $1 < A_2 < N$, larger numbers for $A_1$ and $A_2$ are neither necessary nor easily generated, $A_1 = B$ and $A_2 = N$ are clearly trivial, these would indicate the use of divide-by-1 circuits which would be meaningless. The value $A_2 = 1$ seems trivial in so far that the output 31 also gives one pulse per N positions, which would reduce FIG. 4 to FIG. 2, but it may be useful to reach a particular synchronisation if outputs 48 and 31 are in antiphase, so that $A_2 = 1$ in FIG. 4 may be sensible in some cases ($A_2 = N'$).

Figure 5:
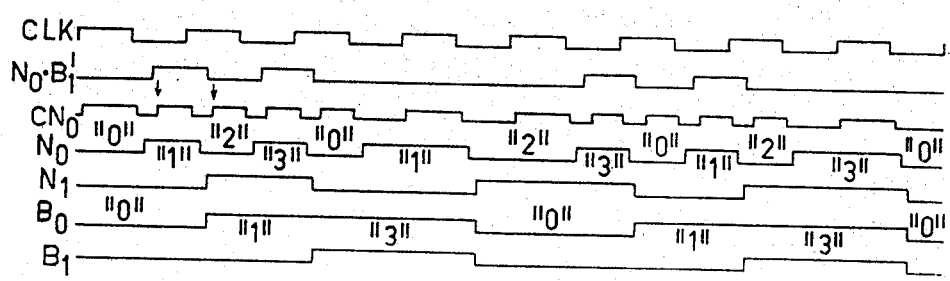
FIG. 5 shows a timing diagram for a frequency divider of FIG. 4 for N=4, B=3, $A_1$=2, $A_2$=2.

FIG. 5 shows a timing diagram for a frequency divider according to FIG. 4. By way of example the following values have been chosen:
N=4 (positions "0", "1", "2" and "3")
B=3 (positions "0", "1" and "3")
$A_1 = 2$
$A_2 = 2$ The N-position counter has its flip-flop $N_o$ connected to output 48 giving an output pulse for each odd position ("1" and "3").

A signal $A_1 = N_o.B'_1$ is generated to obtain two pulses during positions "0" and "1" of the B-counter, that is two per cycle of the B-counter, that is the signal $A_1$ has a number $A_1$ of output pulses per cycle of the B-position counter.

The timing diagram is shown on an extended scale, so that the detailed sequencing of pulses due to (transistor) delay-times can be shown.

Again the signal $A_1$ is found at output 39 of counter 37 and it is clear that the signal CN reverses its polarity twice for each $A_1$ pulse, i.e. $A_1 \times A_2$ times in every full divider cycle. The first two extra polarity reversals have been indicated by an arrow in FIG. 5.

Figure 6:
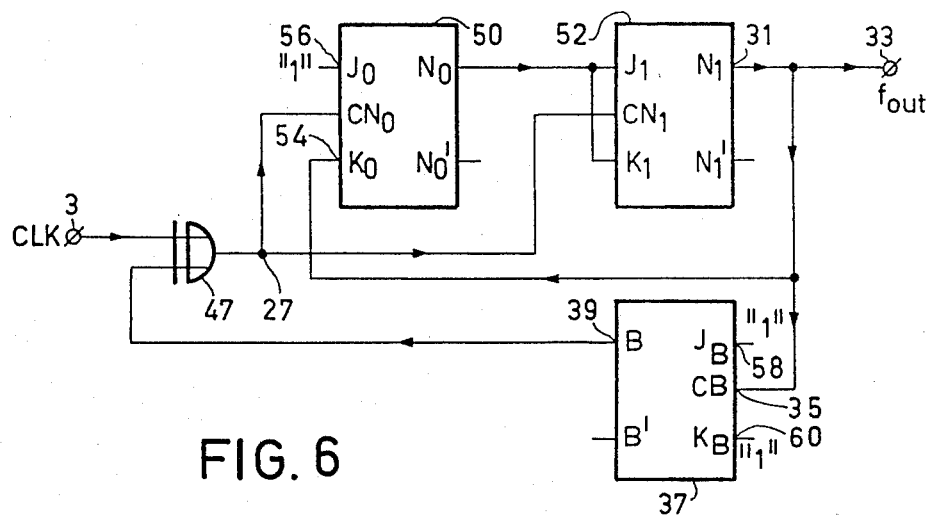
FIG. 6 shows an example of a 2.5 divider, using J-K flipflops.

FIG. 6 shows an actual implementation of a divide-by-2.5 circuit using JK-flip-flops such as the Signetics 54113 or similar. These dual JK-flip-flops are negative edge triggered. Again this is only by way of illustration and not essential for the invention. Other types of flipflops can be used, including positive edge triggered JK-flip-flops, the necessary changes in circuit details being routine matter for the common expert in the field.

The N-position counter consists of two flip-flops 50 and 52 interconnected in a standard way to form a modulo-3 counter, due to the fact that the $K_o$ input 54 of flip-flop 50 is connected to the $N_I$ output of flip-flop 52.

The B-position counter 37 consists of one single flip-flop generating one B-pulse for every two $N_I$ pulses.

In this example we have N=3, B=2 and A=$A_I$=1 so that the divisor becomes $$N - \frac{A}{B} = 3 - \frac{1}{2} = 2.5.$$

The timing diagram for this divider is not shown but is of similar nature as that of FIG. 3.

The further JK-inputs 56.58 and 60 receive a logical "1" permanently, in practice this usually means that these inputs are connected to the divider power supply, not shown in the diagrams.

In the case that input 54 or $K_o$ is also receiving a permanent "1" instead of being connected to the output 31, the N-position counter would be cycling through all four possible positions resulting in a divide-by-3.5 frequency divider.

As indicated above in the introduction of this description, the divisors needed in practice will not always be as simple as 2.5 or 3.5 so that following the procedure as illustrated in FIGS. 2, 4 and 6 will lead to very large B-positions counters, possibly comprising even more flip-flops that the main N-positions counter.

Assume that a divisor is needed which is only slightly larger than 2.5. Such a divisor can be obtained by either periodically delaying the sequence of extra polarity reversals, or by periodically suppressing an extra polarity reversal.

Figure 7:
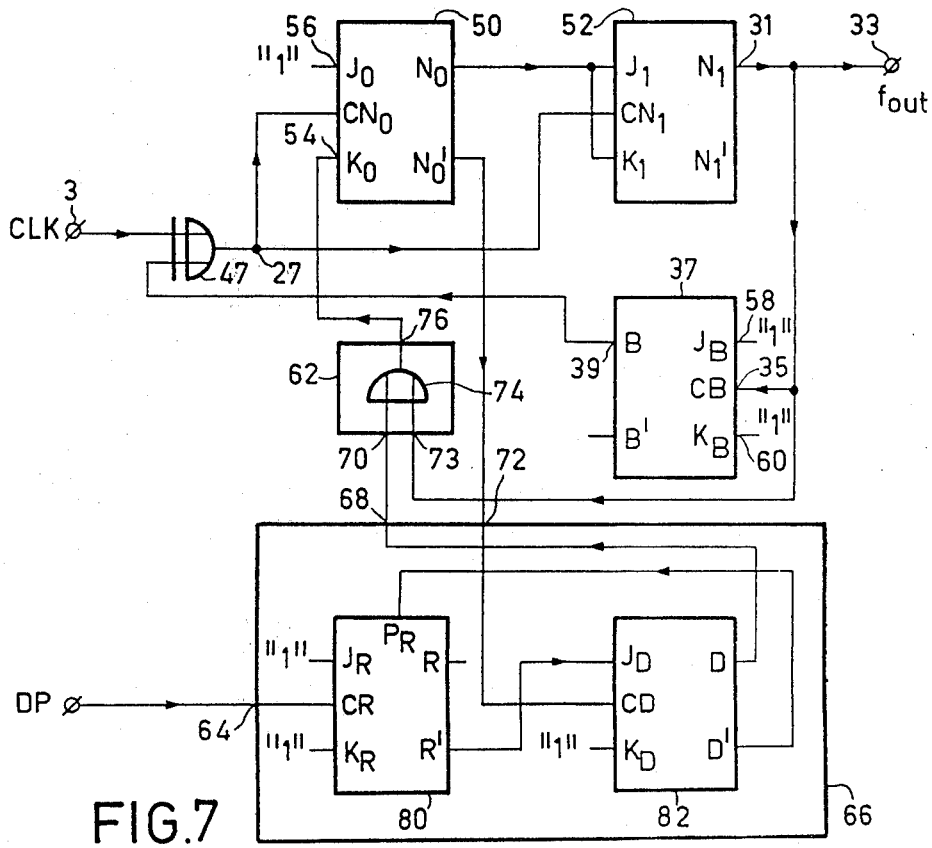
FIG. 7 shows an example of a 2.5 divider using an N=3 counter which will count up to 4 periodically, once for each delay pulse.

An example according to the invention of the first possibility is shown in FIG. 7. This frequency divider is easily understood with the insight that the sequence of extra polarity reversals can be delayed for one CLK period by letting the N-position counter counting up to N+1 once. In the example of FIG. 6 this means that sometimes the clock frequency is divided by 2.5, sometimes by 3.5 by keeping $k_o$ "1" for one N+1 position cycle. By choosing the number of times per time-unit, e.g. per second that we divide by 3.5 instead of 2.5, any divisor between 2.5 and 3.5 can be obtained.

For this purpose the frequency divider comprises a function switch 62 that switches the N-position counter into a (N+1)-position counter once for every delay pulse DP fed to an input 64 of a delay circuit 66 having an output 68 connected to an input 70 of the function switch 62 and having a synchronization input 72.

In this example the function switch 62 is formed by a single OR-gate its two inputs forming the input 70 and a further input 73 of the function switch 62, its output forming the output 76 of the function switch 62. This output 76 is connected to the $K_o$ input 54 of the counter flip-flop 50 and the further input 73 is connected to the counter-output 31.

If the output 68 indicated as signal D is "0" then $k_o$ will follow $N_1$ and tne N-position conter is identical to the one of FIG. 6, dividing by 2.5. If, however, the signal D is a 37 1" at least during the end of the "01" position of the counter, its next position will be "10" instead of "11", followed again by a "11"-position, the $N_I$-output being "0" during the "00" and "01" positions of the counter, and "1" during the "10" and "11" positions, so that $N_o$ will toggle from "10" to "11" to "00".

Using simple numbers for an example, a CLK frequency of 10.000 Hz would be required to get a $f_{out}$ frequency of 4000 Hz with the 2.5 frequency divider of FIG. 6.

Assuming that in FIG. 7 50 Hz pulses are fed to the function switch input 70, 50 times per second one more clock pulse is needed for every full cycle of the N-position counter, so 10.000+50 clock pulses result again in 4000 output pulses. This equals a division by $$\frac{10.050}{4000} = 2.5125 = 2\frac{41}{80} = 3 - \frac{39}{80}.$$

In a frequency divider according to FIG. 2 this already would require an 80-position auxiliary counter having 7 counting flip-flops or bits.

The delay pulses can be supplied by any suitable source, possibly derived from $f_{out}$. If the phase relation is known no special synchronisation is required, especially when operating with high CLK frequencies. A simple example of a synchronising method is shown in the delay circuit 66 of FIG. 7, comprising two flipflops 80 and 82 interconnected as shown in the figure.

Assume that an asynchronous DP (delay pusle) of unknown length is fed to the input 64 of the delay circuit. At the end of this pulse, a negative edge, flipflop 80 will toggle, $J_r=K_r$ being a permanent "1". If the starting position of the flip-flop 80 is the position in which the output R'="0", or flip-flop content "1", it will toggle to "0" corresponding with R'=1. Flip-flop 82, normally in the posiiton "0" or D="0", will toggle to D="1" on a negative edge of signal $N'_o$ which occurs when the counter N steps up from "00" to "01". Now D'="0" will preset flip-flop 80 to the starting position "1" again in which position it remains until the negative edge of a later DP. D="1" is now true during position "01" of the N-counter, which will step-up to "10" on the next CN-pulse, making $N_I$="1" so that D is irrelevant for the next counting step. At the moment the N-counter steps from "10" to "11" again the signal $N_o$ will have a negative edge. Since $J_D$="0" again and $K_D$="1" permanently, flip-flop 82 will be reset to "0" or D="0". All further $N_o$ negative edges before the next DP will only reconfirm this reset.

Again the invention is not limited to the example given in FIG. 7. Many variations lie within easy reach of the common expert. Any state of the art synchronization circuit can be used, with a rather wide margin for the timing, the only requirement being that a D-pulse always overlaps at least the last part of a counting position such as position "01" in this example, up to a whole cycle.

The function switch may have many possible forms, mainly depending on the choice of N and on the chosen flip-flop technology.

A very common way is to use a separate reset signal RS, so if by way of example a 4-bit counter has to be reset when reaching position "13" a simple AND-gate will be used to $$RS = N_3 \cdot N_2 \cdot N'_1 \cdot N_0 (\text{"1101"}).$$

The counter can be reset when reaching position "14" instead of "13" with $$RS = N_3 \cdot N_2 \cdot N_1 \cdot N'_o (\text{"1110"}).$$

The function switch would again be an OR-gate combining these two, using the D-signal:

$$RS = N_3 \cdot N_2 \cdot N'_1 \cdot N_o \cdot D' + N_3 \cdot N_2 \cdot N_1 \cdot N'_o \cdot D,$$

as usual the least significant counting flip-flop is denoted as $N_o$ with outputs $N_o$, $N'_o$; and so on.

Figure 8:
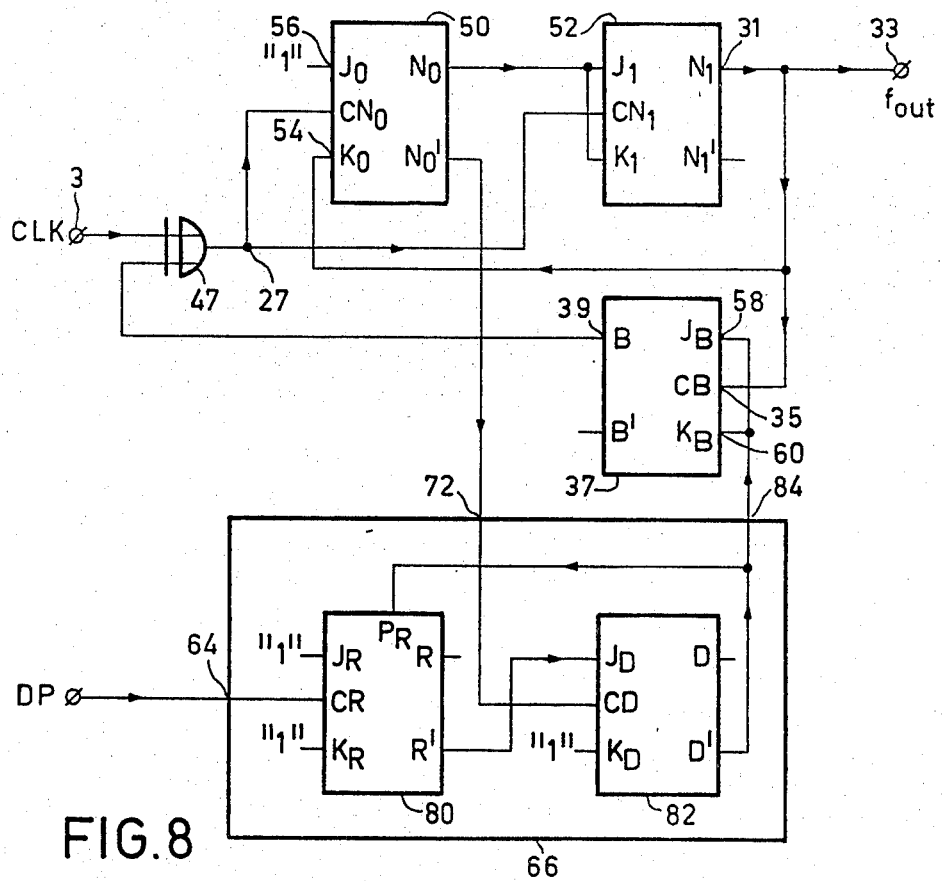
FIG. 8 shows an example of a 2.5 divider according to the invention with a delay switch for suppressing electrical pulses from the N-position counter to the auxiliary counter, once for each delay pulse.

An example of the second possibility, skipping one extra polarity reversal for each DP is shown in FIG. 8. In this case a frequency divider similar to that of FIG. 6 is combined with a delay circuit 66. In the example the delay circuit is functioning identically to that used in FIG. 7 but here an output 84 for the signal D' is used.

Here too the normal starting position is D="0" and therefore D'="1".

The JK-inputs 58, 60 of the auxiliary counter 37 are connected to the D' signal output 84 of the delay circuit 66 instead of being connected to a permanent "1" signal like the power supply voltage.

As long as D'="1" however, the frequency divider operates in exactly the same way as that of FIG. 6.

If however D'="0" for one counting cycle or less, but at least overlapping the negative edge of the $N_1$-output signal on counter output 31, this suppresses the effect of this edge, because the JK-flipflop will not toggle when $J_B = K_B = $ "0".

The signal B will therefore not switch over at the usual moment, no extra signal polarity reversal occurs, therefore the N-position counter functions as a normal divide-by-3 circuit, once for every signal DP pulse. Depending on the frequency of DP any divisor between 2.5 and 3 can be obtained in this way.

Each DP-pulse results in omitting one of the extra 180° phase leads, two DP pulses therefore have the same effect as if one clock pulse CLK had been omitted or suppressed.

For the same example as given before, needing an extra 50 CLK pulses to obtain the same 4000 Hz output, now 100 Hz DP pulses have to be fed to the delay circuit input 64.

The delay circuit is synchronised with the $N'_o$ signal on the synchronisation input 72 of the delay circuit 66 in exactly the same way as described for FIG. 7.

Figure 8A:
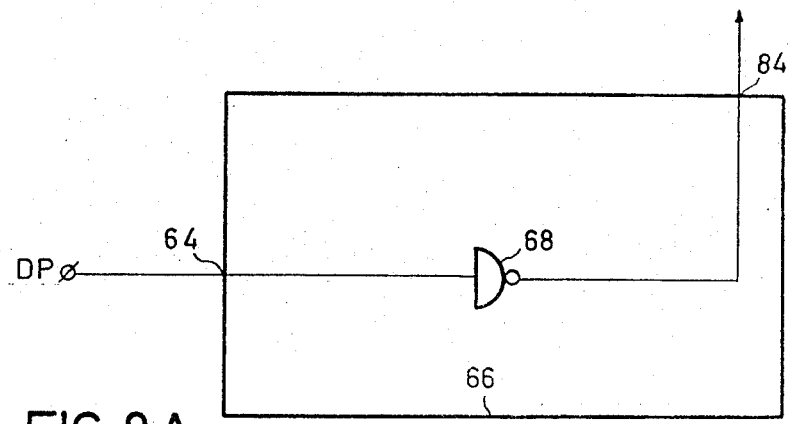
FIG. 8a showing a simplified delay circuit.

Again it will be clear that if the signal DP is already a synchronous signal of correct length then the delay circuit can be much more simple. Assuming DP to be positive, going a simple inverter 86 will generate a negative going DP' which can be connected via output 84 of the delay circuit to the JK-inputs 58, 60 of the auxiliary counter 37, as indicated in FIG. 8A.

Figure 9:
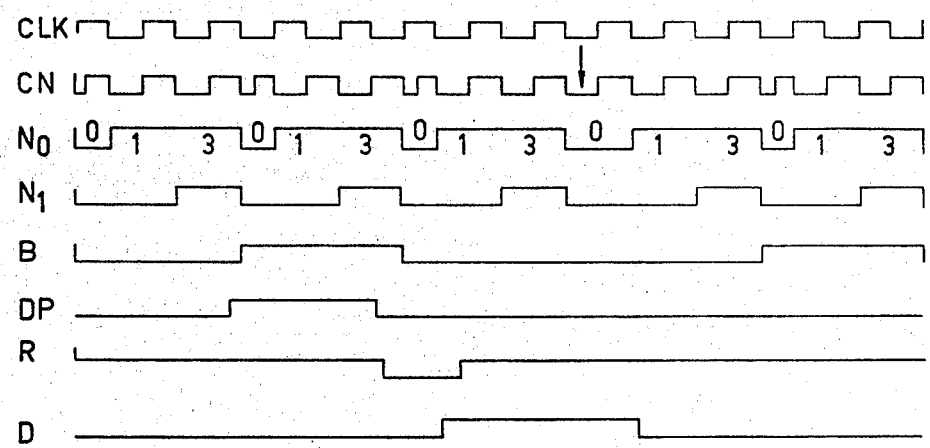
FIG. 9 shows a timing diagram for a frequency divider according to FIG. 8.

FIG. 9 shows a timing diagram for a frequency divider according to FIG. 8. At the moment indicated by the arrow the expected extra polarity reversal is missing due to D="1" and therefore D'=$J_B$=$K_B$="0". The N-position counter remains in the "00" position for a full CLK period instead of for half a CLK period.

A full N-cycle generally has the length of 2.5 CLK periods, but of 3 CLK periods if a DP pulse results in a D pulse, i.e. the divider dividing by 3 instead of 2.5.

The timing of DP, R and D is exactly as described above for FIG. 7.

Figure 10:
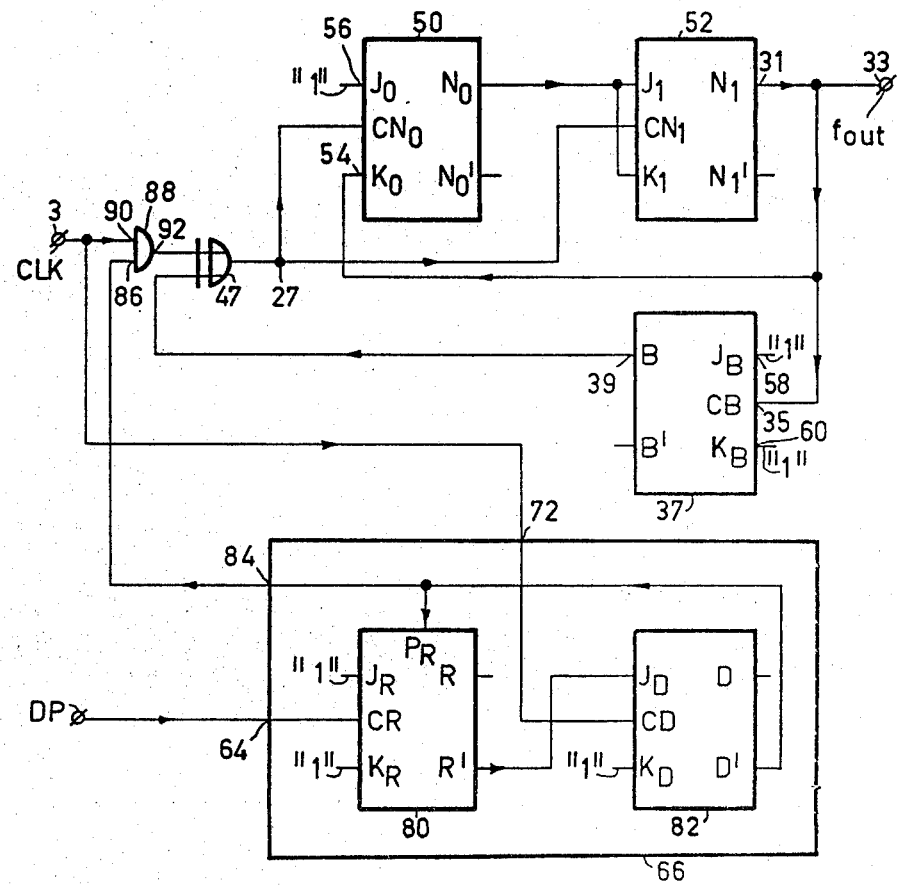
FIG. 10 shows an example of a 2.5 divider comprising a delay circuit for suppressing clock pulses.

Another way to delay the action of the frequency divider for one clock pusle period is shown in FIG. 10. In this example the N-position counter and the auxiliary counter are identical to FIG. 6, the delay circuit 66 is identical to that of FIG. 8.

The D'-output 84 of the delay circuit is connected to an input 86 of an AND-gate 88 of which a further input 90 is connected to the CLK-input 3 and its output 92 is connected to the signal polarity switch 47.

The synchronization input 72 of the delay circuit 66 is also connected to the CLK-input 3.

As long as D'="0" the output 92 of the AND-gate 88 will be identical to the clock signal CLK and the frequency divider operates in the same way as that of FIG. 6.

If however the negative edge of a DP-pulse is followed by a positive going R' the flipflop 82 will toggle just after the first negative edge of CLK during R'="1", which then will preset the flipflop 80 to R'="0" and switch back to D'="1" just after the next negative CLK edge.

As long as D'="0" the output 92 of the AND-gate is a binary 0", so that a single CLK pulse is suppressed in this way.

If DP occurs e.g. 50 times per second again, the CLK frequency must be increased with 50 Hz to obtain the same $f_{out}$ frequency as would be obtained without delay pusles DP.

The timing diagram is self-evident and is not illustrated therefore.

The same result can be obtained if a CN-pulse is suppressed or made inoperative instead of a CLK pulse, by inserting the AND-gate 88 between the signal polarity switch 47 and the CN input 27 of the N-position counter. The synchronization input 72 of the delay circuit 66 may be controlled by CLK or CLK', or the output signal of the signal polarity switch 47, these variations are not illustrated in a Figure but will be clear from FIG. 10 assuming gates 47 and 88 being interchanged.

The common expert will be able to adapt a digital frequency divider to any specification by using combinations of counters of suitable length with a signal polarity switch, using if necessary for complicated divisors a function switch or a suppressor circuit similar to those explained with the Figures with or without synchronization means in the delay circuit.

Furthermore any type of counter may be used in any type of semiconductor or even vacuum tube technology.

As stated in the introduction of this description an important application of digital frequency dividers according to the invention is in timing circuits for video displays using a standard television receiver.

Two examples of implementations for applications in combination with a standard PAL-TV-receiver are shown.

Figure 11:
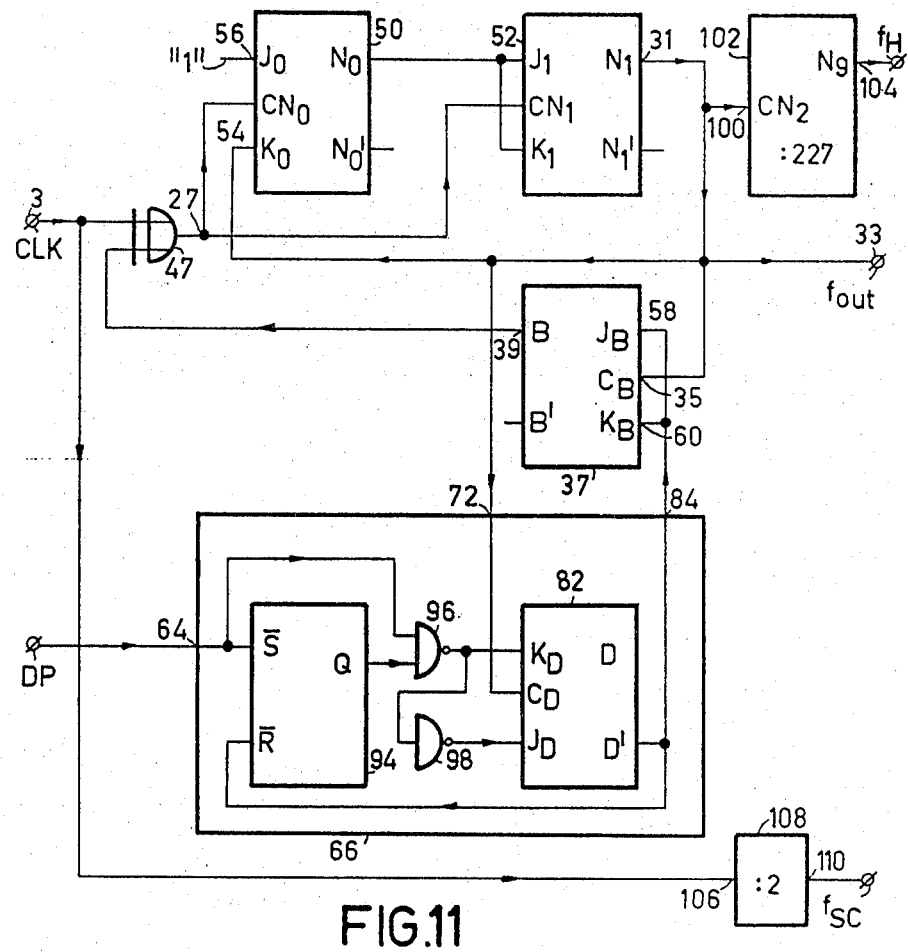
FIG. 11 shows a simplified block diagram for a video timing circuit comprising a 2.5 divider.

FIG. 11 shows a divide-by-25 circuit essentially the same as that of FIG. 8, with the exception that the delay circuit is implemented with a $\overline{S}$-$\overline{R}$ latch 94, and NAND-gate 96 and an invertor 98 instead of the flipflop 80. For the $\overline{S}$-$\overline{R}$ latch one of a Signetics 54279 guad latch can be used, or any similar $\overline{S}$-$\overline{R}$ latch.

The normal position of the flipflops just before a DP pulse arrives is Q="1", D="0", D'="1" with DP="0". Due to D'="1" the frequency divider divides normally by 2.5 as explained with FIG. 6. D'="1" makes R="1" and DP="0" makes $\overline{S}$="0", Q will remain "1".

When DP changes to "1" it follows that $\overline{S} = \overline{R} = $ "1" so that Q remains in its position according to the $\overline{S}$-$\overline{R}$ latch truth table as given in the Phillips Data Handbook for Signetics Integrated Circuits 1976, part 1, page 221 (top).

DP="1" and Q="1" result $K_D$="0" and $J_D$="1" so that the flipflop 82 will switch to D="1", D'="0" just after a negative edge of the $N_I$ output 31 at the end of a full N-position cycle when the counter changes from position "11" to position "00".

Now $\bar{S}$="1" and $\bar{R}$="0" therefore the flipflop 94 switches to Q-"0" giving $K_D$="1" and $J_D$="0", so that flipflop 82 will be reset by the next negative edge of $N_I$. During the period in which D="1" and D'-"0" the frequency divider will divide once by 3 instead of 2.5 as explained for FIG. 8.

When D'=R="1" and S="1", Q="0" will remain until the end of DP when S becomes "0" and flipflop 94 will be preset to Q="1".

Now however Q="1" and DP="0" still result in $K_D$="1" and $J_D$="0" so that D"="1" will remain for all following negative $N_I$ edges until a new DP restarts the delay circuit cycle.

Although the synchronization input 72 of the delay circuit 66 is connected to the $N_I$ output 31 in this example, synchronization by $N_0$ could be used as well, advancing the D-pulse slightly but still having a length equal to 3 clock periods.

The output 31 of the divide-by-2.5 circuit is connected to the input 100 of a further frequency divider 102 for an integer divisor, 227 in this example, thus needing 8 flipflops $N_2$ through $N_9$, the output 104 generating a frequency $$f_H = \frac{f_{out}}{227}.$$

Furthermore the CLK input 3 is connected to the input 106 of a divide-by-2 circuit 108 of which an output 110 generates a frequency $$f_{sc} = \frac{f_{CLK}}{2}.$$

Using a nominal $f_{CLK}$=8,867,237.5 Hz thus $f_{sc}$=4,433,618.75 Hz nominal, which is the nominal PAL sub-carrier frequency.

Using 100 Hz DP-pulses as explained with FIG. 8 has the effect as if the frequency divider operated with a CLK frequency of 8,867,237.5−50=8,867,187.5 Hz and dividing this frequency by 2.5 so that $$f_{out} = \frac{8867187.5}{2.5} = 3546875 \text{ Hz}$$

nominal or approximately 3.5 MHz, a frequency that can be used as a clock frequency for integrated circuits designed for application in the U.S.-NTSC video-system.

A further division by 227 results in $$f_H = \frac{3546875}{227} = 15625 \text{ Hz}$$

the nominal PAL video line-frequency.

As stated before this results in an apparent divisor equal to $$\frac{8867237.5}{15625} = 567.5032 = 568 - \frac{621}{1250}$$

A straight frequency divider according to FIG. 2 or FIG. 4 would require an eleven bit auxiliary counter for B=1250 positions, so that the use of delay pulses DP already available in the circuit requiring only three flipflops.

Figure 12:
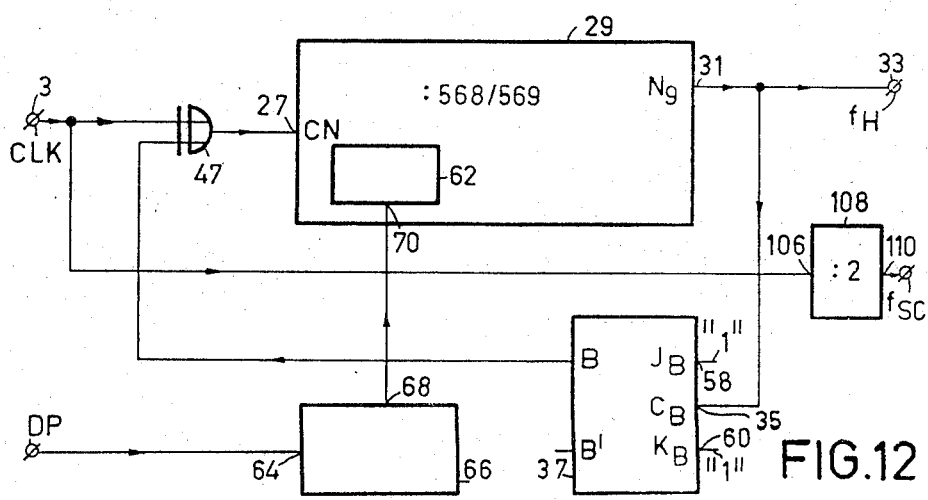
FIG. 12 shows a simplified block diagram for a video timing circuit comprising a 567.5 divider.

The second example of a video timing circit is shown in FIG. 12. This digital frequency divider is based on a circuit according to FIG. 7 using a N-position counter 29 with a function switch 62. The counter will cycle normally through 568 positions, but will cycle through N+1=569 positions once for every delay pusle, using a delay circuit as described in FIG. 7, FIG. 11 or similar. Again a divide-by-2 circuit 108 is incorporated as in FIG. 11 to obtain fsc=FCLK/2.

Using 50 Hz delay pulses will have the effect as explained with FIG. 7, i.e. as if (8,867,237.5−50) Hz pulses were divided by 568−½=567.5 resulting in $$f_H = \frac{8867187.5}{567.5} = 15625 \text{ Hz nominal.}$$

Again many variations using the same inventive steps can be easily designed, each resulting in simple and error free video timing circuits.

We claim:

1. A digital frequency divider having a divider input for electrical input pulses and a divider output for an electrical output signal, comprising;

an N-position counter having a counter input and at least one counter output; said divider input being coupled to the counter input; said divider output being connected to said counter output;

a signal polarity switch;

a B-position auxiliary counter having an auxiliary counter input coupled to a counter output of said N-position counter;

an auxiliary counter output commanding said signal polarity switch;

a switch input coupled to said divider input;

a switch input coupled to the counter input of the N-position counter;

a delay circuit with a delay input for electrical delay pulses; said delay circuit delaying the action of said frequency divider for at least one-half period of a sequence of electrical input pulses at said divider input for each single delay pulse.

2. A digital frequency divider as claimed in claim 1, wherein said N-position counter comprises a function switch that switches said counter from reset after N-positions to reset after (N+1) positions when said function switch is activated by said delay circuit.

3. A digital frequency divider as claimed in claim 1, wherein:

said delay circuit couples the counter output of said N-position counter to the auxiliary counter input of said auxiliary counter; and said delay circuit comprises a delay switch for suppressing at least one electrical pulse from said N-position counter to the auxiliary counter when the delay circuit is activated by a delay pulse.

4. A digital frequency as claimed in claim 1, wherein:

said delay circuit couples the switch output of said signal polarity switch to the counter input of said N-position counter; and said delay circuit comprises a delay switch for making inoperative at least one electrical pulse from said signal polarity switch to said N-position counter when the delay circuit is activated by a delay pulse.

5. A video timing circuit for supplying a colour subcarrier signal and a video line-frequency signal, comprising:
- a digital frequency divider as claimed in claim 2 with n=568, B=2;
- a clock oscillator for a nominal frequency of 8,867,237.5 Hz;
- a further divide-by-2 circuit;
- wherein a clock output of the clock oscillator is connected to the divider input and to an input of the further divide-by-2 circuit of which an output is the output for the color subcarrier signal, the delay input is connected to a source for 50 Hz delay pulses and the divider output is the output for a 15,625 Hz nominal video line-frequency signal.

6. A video timing circuit for supplying a colour subcarrier signal and a video line-frequency signal, comprising a digital frequency divider as claimed in claim 3 with N=3, B=2;
- a clock oscillator for a nominal frequency of 8,867,237.5 Hz;
- a further divide-by-2 circuit;
- a divide-by-227 circuit;
- wherein a clock output of the clock oscillator is connected to the divider input and to an input of the further divide-by-2 circuit of which an output is the output for the color subcarrier signal, the divider output is connected to an input of the divide-by-227 circuit, the delay input is connected to a source for 100 Hz delay pulses and an output of the divide-by-227 circuit is the output for a 15,625 Hz nominal video line-frequency signal.

* * * * *